(12) United States Patent
Kurimski et al.

(10) Patent No.: US 6,524,126 B1
(45) Date of Patent: Feb. 25, 2003

(54) MODULE SUPPORT

(75) Inventors: Mike Kurimski, Springfield, OH (US); Eike Waltz, Aptos, CA (US)

(73) Assignee: Rittal-Werk Rudolf Loh GmbH & Co. KG, Herborn (DE)

( * ) Notice: Subject to any disclaimer, the term of this patent is extended or adjusted under 35 U.S.C. 154(b) by 0 days.

(21) Appl. No.: 09/831,035

(22) PCT Filed: Nov. 9, 1998

(86) PCT No.: PCT/EP98/07125
§ 371 (c)(1),
(2), (4) Date: May 3, 2001

(87) PCT Pub. No.: WO00/28800
PCT Pub. Date: May 18, 2000

(51) Int. Cl.[7] .............................................. H01R 13/64
(52) U.S. Cl. ...................................................... 439/377
(58) Field of Search ................................ 439/377, 489; 174/138 F, 138 R; 361/756, 801, 802

(56) References Cited

U.S. PATENT DOCUMENTS 4,894,749 A * 1/1990 Elko et al. ............. 165/104.33
5,034,853 A * 7/1991 Mazura et al. ............ 211/41.17

FOREIGN PATENT DOCUMENTS

DE          38 37 029 C2      1/1992

* cited by examiner

Primary Examiner—Lynn D. Feild
Assistant Examiner—Phuong Dinh
(74) Attorney, Agent, or Firm—Pauley Petersen Kinne & Erickson

(57) ABSTRACT

A module support having two parallel cross struts which are interconnected by guide rails which have a guide fixture wherein printed circuit boards can be displaced in a longitudinal direction of the guide rails. One or more air guides are arranged at the side of the guide rails and the air guide of a guide rail which is not occupied by a printed circuit board can be covered with a cover. The guide rail can be connected to the cover by detent connections in order to produce a preassembled unit. As a result, the assembly of this cover is simplified.

16 Claims, 2 Drawing Sheets

MODULE SUPPORT

BACKGROUND OF THE INVENTION

1. Field of the Invention

This invention relates to a module support or a component support with two transverse struts parallel with each other and connected with each other by guide rails. The guide rails have a guide receiver, in which printed circuit boards can be displaced in a longitudinal direction of the guide rails. One or several air guide elements are arranged laterally of the guide rail and the air guide element of a guide rail which is not occupied by a printed circuit board can be covered with a cover.

2. Description of Related Art

Such a component support is known from German Patent Reference DE 38 37 029 C2. The covers in this component support is designed hood-like. The covers have a cover section, on which a guide strip is fastened. The guide strip engages the guide receiver of the guide rail.

The cover section has a vertical holding element extending up to the transverse struts. Rows of fastening receivers are cut into the transverse struts, wherein the fastening receivers are spaced apart from each other in a separating grid. The holding element of the cover has fastening projections which can be inserted into the fastening receivers of the transverse strut. The attachment of the covers to the transverse struts is particularly difficult in case of limited space conditions in the component support. For fixing the covers in place, fastening projections of the holding elements must be attached on the front, as well as on the rear transverse strut. The insertion of the rear fastening projection into the associated fastening receiver entails difficulties.

SUMMARY OF THE INVENTION

It is one object of this invention to provide a component support of the type mentioned above but wherein a simple attachment of the cover on the guide rail is possible.

This object is attained with a guide rail that can be combined with the cover into a preassembled unit with snap-in connectors.

It is possible with this design to position the cover together with the guide rail and to fasten them in one work step. Nevertheless, when required, the cover can be easily removed from the guide rail, for which the snap-in connection must be released.

In accordance with one preferred embodiment of this invention, at ends of the guide receiver the guide rail is widened in the longitudinal direction of the transverse struts by two projections. The guide receiver and the projections laterally limit the air guide element and the cover has a plate covering the air guide element. To prevent a printed circuit board from being inadvertently inserted into the guide receiver when the cover is placed on the guide receiver, the cover has one or two projections which extend over ends of the guide receiver.

So that the available structural space in the component support is not restricted because of the cover, in accordance with this invention the cover has a strip which is laterally placed against the guide receiver and a structural height of the cover does not exceed the structural height of the guide receiver.

The embodiment of the snap-in connection can be such that two snap-in elements, which face each other, are formed on the cover and the guide rail has two openings, which are used as air guidance, engaged by snap-in elements snapping into the openings.

So that the cover can be rapidly and simply released from the guide rail, the cover can have a tool holding fixture and/or a handle.

Preferably, a width of the cover extending in the direction of the transverse struts is equal to or less than the width of the guide rail.

To assure a simple and exactly fitting mounting of the cover on the guide rail, the cover has guide projections which align the cover on the guide rail prior to the snapped-in engagement of the snap-in connection.

BRIEF DESCRIPTION OF THE DRAWINGS

This invention will be explained in greater detail in view of an exemplary embodiment represented in the drawings, wherein.

DESCRIPTION OF PREFERRED EMBODIMENTS

Figure 1:
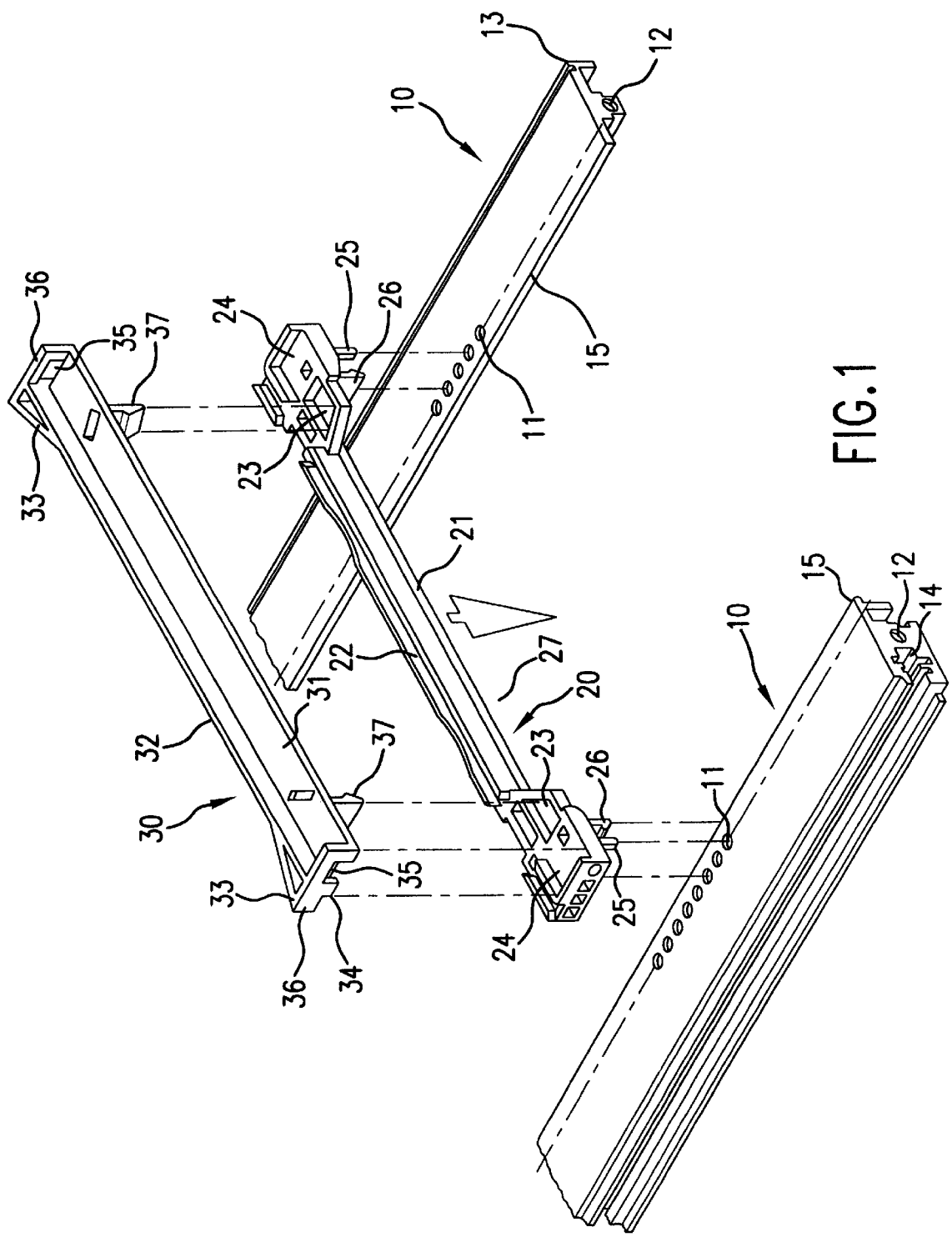
FIG. 1 shows two transverse struts of a component support, as well as a guide rail and a cover, in an exploded perspective view.

Two transverse supports 10 of a component support are shown in FIG. 1 and are embodied as extruded profiled sections which can be cut off from a semi-finished profiled section. Each of the transverse struts 10 has a screw channel 12 extending in the longitudinal direction of the profiled section. The rear transverse strut 10 has a rear holder 10, on which profiled plastic sections can be fastened. The profiled plastic sections are used for insulated installation of rear plate elements. The front transverse strut 10 has an undercut groove 14, on which attachments can be fixed. Each of the two transverse struts 10 has a snap-in edge 15 facing the interior of the component support. The transverse struts 10 have rows of fastening receivers 11 in the area of the snap-in edges 15, wherein the fastening receivers are arranged spaced apart from each other in a separating grid. The rows of fastening receivers 11 extend in the longitudinal direction of the transverse struts 10.

Guide rails 20 can be fastened on the fastening receivers 11. The guide rails 20 have a support section 21 which extends in the direction of the depth of the component support. The support section 21 has a guide receiver 22 designed with a U-shaped cross section and used for receiving printed circuit boards. Projections 24 are arranged at ends of the support section 21. The support section 21 is widened in the direction of the longitudinal extension of the transverse struts 10 by means of the projections 24. Pins 25 and snap-in projections 26 are formed on the projections 24. The pins 25 and snap-in projections 26 project in the direction toward the transverse struts 10. Two pins 25 and one snap-in projection 26 are provided per projection 24. For mounting the guide rail 20 on the transverse struts 10, the pins 25 are inserted into the fastening receivers 11. In the inserted state, the snap-in projections 26 are snapped in behind the snap-in edges 15 of the transverse struts 10.

The projections 24 and the support section 21 or the guide receiver 22 delimit an air guide element 27. Also, openings are provided in the projections 24, which can also be used for air guidance. These air guide elements are also used as snap-in receivers for fixing a cover 30 in place. The air guide elements 27 and the snap-in receivers 23 are used for supplying the printed circuit card, which is inserted into the guide receiver 22, continuously with air. In case no printed circuit card is inserted into the guide receiver 22, the air guide elements 27 or 23 can be covered by means of the cover 30.

The cover 30 has a horizontal plate 31, which is followed by a vertical strip 32. The plate 31 has closing walls 36 at both ends on the longitudinal side. The closing walls 36 extend in the horizontal direction past the strip 32 and in this way form lateral protrusions 33. The closing walls 36 have tool holding fixtures 35 in the area of the plate 31. The tool holding fixtures 35 are designed as openings. Guide projections 34 are arranged between the tool holding fixtures 35 and the protrusions 33.

Two snap-in elements 37 are formed as one piece with the cover 30 on the underside of the plate 31. The snap-in elements 37 have snap-in protrusions facing each other.

Figure 2:
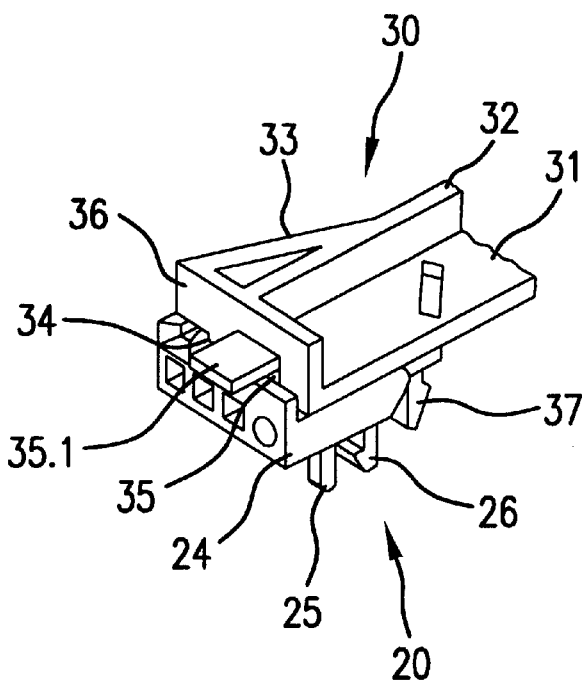
FIG. 2 shows the cover mounted on the guide rail in a perspective view.
Figure 3:
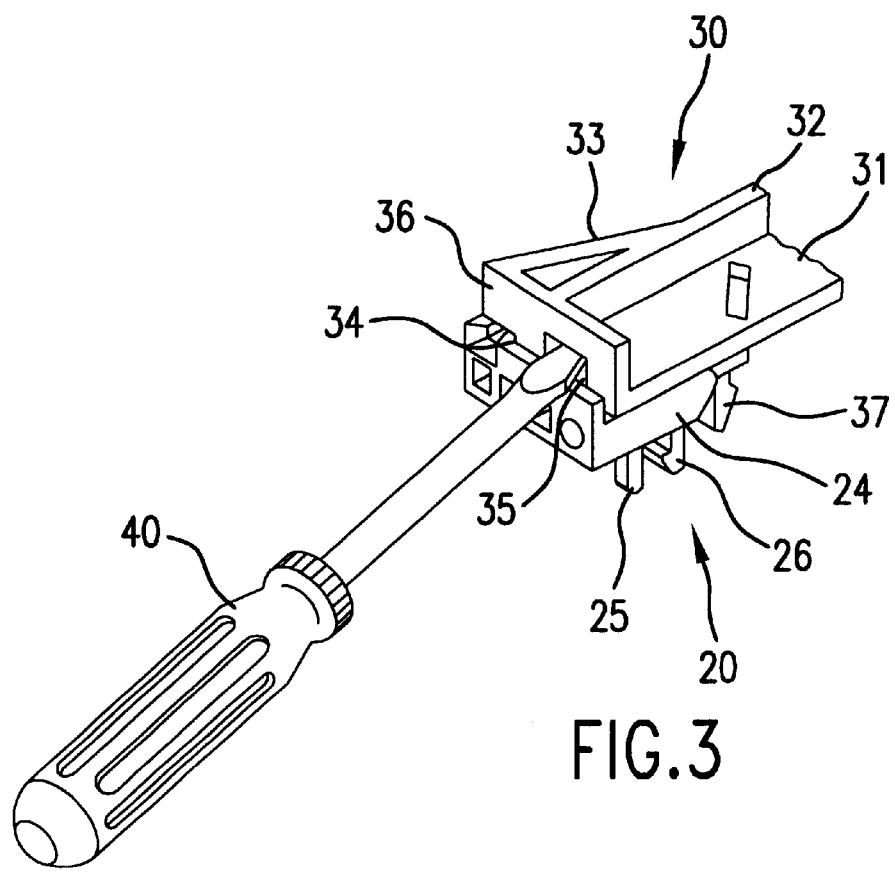
FIG. 3 shows the component represented in FIG. 2, complemented by representation of a tool.

The snap-in elements 37 are inserted into the snap-in receivers 23 for fastening the cover 30 on the guide rail 20. During this, the snap-in protrusions of the snap-in elements 27 are deflected at the edge of the snap-in receiver 23 until they snap in behind it. When inserting the snap-in elements 37 and prior to the snapping-in occurring, the guide projections 34 are laterally aligned on the guide receivers 22, as shown in FIGS. 2 and 3. Because of this alignment, a precisely fitting mounting of the cover 30 becomes easily possible. In the mounted state, the strip 32 of the cover 30 rests laterally against the guide receiver 22. The plate 31 covers the air guide element 27 or the snap-in receiver 23.

FIG. 2 shows that the width of the cover 30 corresponds to the width of the guide rail 20. The cover 30 can be preassembled together with the guide rail 20 to form a unit, which can be mounted as such in the component support. If a printed circuit card is inserted into the guide rail 20, the cover 30 can be easily removed. Two variations of this, which permit a simple removal of the cover 30, are shown in FIGS. 2 and 3. In accordance with FIG. 2, a handle 35.1 is formed in the area of the tool holding fixture 35 for this purpose. The handle 35.1 is designed as a flap, which projects at right angles from the closing wall 36. A finger can be inserted underneath the handle 35.1, and the cover 30 can then be lifted, during which the snap-in elements 37 disengage from the snap-in receivers 23. Removal of the cover 30 is also possible by means of a tool which can be inserted into the tool holding fixture 35. The cover 30 can then be levered up, wherein the tool is supported on the front of the guide rail. With the embodiment in accordance with FIG. 3, a screwdriver 40 can be used as the tool, which is inserted into the tool holding fixture 35. The cover 30 can be levered up with the screwdriver 40.

What is claimed is:

1. In a component support having two transverse struts which are parallel with each other and are connected with each other by guide rails, wherein each of the guide rails has a guide receiver in which a printed circuit board can be displaced in a first longitudinal direction of the guide rails, wherein at least one air guide element is arranged laterally of each of the guide rails, and wherein the at least one air guide element of one of the guide rails which is not occupied by the printed circuit board can be covered with a cover, the improvement comprising:

the guide rail (20) having a snap-in receiver (23) and the cover having a snap-in element (37) forming each of a plurality of snap-in connectors that fasten the guide rail (20) to the cover (30) to form a preassembled unit with the cover blocking air passage through the air guide element.

2. In the component support in accordance with claim 1, wherein the cover (30) has at least one projection (33) which extends over an end of the guide receiver (22).

3. In the component support in accordance with claim 1, wherein the cover (30) has a strip (32) laterally placed against the guide receiver (22) and a first structural height of the strip (32) is less than a second structural height of the guide receiver (22).

4. In the component support in accordance with claim 1, wherein two of the snap-in elements (37) which face each other are formed on the cover (30), and the guide rail (20) has two openings (23) used as air guidance into which the snap-in elements (37) are engaged.

5. In the component support in accordance with claim 1, wherein the cover (30) has at least one of a tool holding fixture (35) and a handle (35.1) for releasing a snapped-in engagement between the cover (30) and the guide rail (20).

6. In the component support in accordance with claim 1, wherein a width of the cover (30) extending in a direction of the transverse struts (10) is equal to or less than a width of the guide rail (20).

7. In the component support in accordance with claim 1, wherein the cover (30) has guide projections (34) which align the cover (30) on the guide rail (20) prior to a snapped-in engagement between the cover (30) and the guide rail (32).

8. In the component support in accordance with claim 1, wherein the cover (30) is formed as one of an injection molded element and an extruded plastic element.

9. In a component support having two transverse struts which are parallel with each other and are connected with each other by guide rails, wherein each of the guide rails has a guide receiver in which a printed circuit board can be displaced in a first longitudinal direction of the guide rails, wherein at least one air guide element is arranged laterally of each of the guide rails, and wherein the at least one air guide element of one of the guide rails which is not occupied by the printed circuit board can be covered with a cover, the improvement comprising:

the guide rail (20) having a snap-in receiver (23) and the cover having a snap-in element (37) forming each of a plurality of snap-in connectors combining the guide rail (20) to the cover (30) to form a preassembled unit, wherein at opposing ends of a guide receiver (22) the guide rail (20) is widened in a second longitudinal direction of transverse struts (10) by two projections (24), the guide receiver (22) and the projections (24) laterally limit the air guide element (27), and the cover has a plate (31) covering the air guide element (27).

10. In the component support in accordance with claim 9, wherein the cover (30) has at least one projection (33) which extends over one of the ends of the guide receiver (22).

11. In the component support in accordance with claim 10, wherein the cover (30) has a strip (32) laterally placed against the guide receiver (22) and a first structural height of the strip (32) is less than a second structural height of the guide receiver (22).

12. In the component support in accordance with claim 11, wherein two of the snap-in elements (37) which face each other are formed on the cover (30), and the guide rail (20) has two openings (23) used as air guidance into which the snap-in elements (37) are engaged.

13. In the component support in accordance with claim 12, wherein the cover (30) has at least one of a tool holding fixture (35) and a handle (35.1) for releasing a snapped-in engagement between the cover (30) and the guide rail (32).

14. In the component support in accordance with claim 13, wherein a width of the cover (30) extending in a direction of the transverse struts (10) is equal to or less than a width of the guide rail (20).

15. In the component support in accordance with claim 14, wherein the cover (30) has guide projections (34) which align the cover (30) on the guide rail (20) prior to the snapped-in engagement.

16. In the component support in accordance with claim 15, wherein the cover (30) is formed as one of an injection molded element and an extruded plastic element.

* * * * *

UNITED STATES PATENT AND TRADEMARK OFFICE
CERTIFICATE OF CORRECTION

PATENT NO. : 6,524,126 B1
DATED : February 25, 2003
INVENTOR(S) : Mike Kurimski et al.

It is certified that error appears in the above-identified patent and that said Letters Patent is hereby corrected as shown below:

<u>Title page,</u>
Item [54], delete "MODULE SUPPORT" and in its place insert:
-- GUIDE FOR PRINTED CIRCUIT BOARD AND COVER FOR THE GUIDE --

Signed and Sealed this

Twelfth Day of August, 2003

JAMES E. ROGAN
*Director of the United States Patent and Trademark Office*